US008105414B2

(12) United States Patent
Zinn

(10) Patent No.: US 8,105,414 B2
(45) Date of Patent: Jan. 31, 2012

(54) LEAD SOLDER-FREE ELECTRONICS

(75) Inventor: Alfred A. Zinn, Palo Alto, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 89 days.

(21) Appl. No.: 12/512,315

(22) Filed: Jul. 30, 2009

(65) Prior Publication Data

US 2010/0065616 A1 Mar. 18, 2010

Related U.S. Application Data

(60) Provisional application No. 61/097,175, filed on Sep. 15, 2008.

(51) Int. Cl.
B22F 1/00 (2006.01)
B22F 1/02 (2006.01)
(52) U.S. Cl. .................... 75/255; 428/570; 977/777
(58) Field of Classification Search .............. 75/252, 75/255; 428/570; 252/182.12, 182.3; 977/777
See application file for complete search history.

(56) References Cited

U.S. PATENT DOCUMENTS

| 3,637,508 | A | 1/1972 | Willsey et al. | |
|---|---|---|---|---|
| 5,159,171 | A | 10/1992 | Cook et al. | |
| 6,645,444 | B2 | 11/2003 | Goldstein | |
| 6,783,569 | B2 * | 8/2004 | Cheon et al. | 75/348 |
| 7,306,823 | B2 * | 12/2007 | Sager et al. | 427/217 |
| 7,419,887 | B1 | 9/2008 | Quick et al. | |
| 7,524,351 | B2 * | 4/2009 | Hua et al. | 75/252 |
| 7,559,970 | B2 | 7/2009 | Kim et al. | |
| 7,628,840 | B2 | 12/2009 | Atsuki et al. | |
| 7,637,982 | B2 * | 12/2009 | Hou et al. | 75/255 |
| 7,736,414 | B1 | 6/2010 | Zinn | |
| 7,847,397 | B2 | 12/2010 | Wu et al. | |
| 7,850,933 | B2 | 12/2010 | Yang et al. | |
| 7,858,025 | B2 | 12/2010 | Shim et al. | |
| 2007/0202304 | A1 | 8/2007 | Golovko et al. | |
| 2007/0290175 | A1 | 12/2007 | Kim | |
| 2008/0003364 | A1 * | 1/2008 | Ginley et al. | 427/276 |
| 2008/0011125 | A1 * | 1/2008 | Shirata et al. | 75/255 |
| 2008/0032132 | A1 | 2/2008 | Woodfield et al. | |
| 2008/0149176 | A1 * | 6/2008 | Sager et al. | 136/262 |
| 2008/0151515 | A1 | 6/2008 | Das et al. | |
| 2008/0278181 | A1 | 11/2008 | Zhong et al. | |
| 2009/0214764 | A1 | 8/2009 | Li et al. | |
| 2009/0301606 | A1 | 12/2009 | Ueshima | |
| 2010/0075137 | A1 | 3/2010 | Sinton | |

FOREIGN PATENT DOCUMENTS

| WO | WO 2009/115643 | 9/2009 |
|---|---|---|
| WO | WO/2010/036114 | 4/2010 |

OTHER PUBLICATIONS

Kogiso, et al., "One-Dimensional Organization of Copper Nanoparticles by Chemical Reduction of Lipid-Copper Hybrid Nanofibers", The Royal Society of Chemistry 2002, pp. 2492-2493.

Yonezawa, et al., "The Preparation of Copper Fine Particle Paste and Its Application as the Inner Electrode Material of a Multilayered Ceramic Capacitor", Nanotechnology 19 (2008) 145706, pp. 1-5.
Yeshchenko, et al., "Size-Dependent Melting of Spherical Copper Nanoparticles", arXiv:cond-mat/0701276v1 [cond-mat.mtrl-sci] Jan. 12, 2007, pp. 1-16.
Wu, et al., "Simple One-Step Synthesis of Uniform Disperse Copper Nanoparticles", Mater. Res. Soc. Symp, Proc. 2005, vol. 879E, pp. Z6.3.1-Z6.3.6.
Foresti, et al., "New Thiophene Monolayer Protected Copper Nanoparticles: Synthesis and Chemical-Physical Characterization", Department of Chemistry "G. Ciamician" Alma Mater Studiorum Bologna University.
Murai, et al., "Preparation of copper Nanoparticles With an Organic Coating by a Pulsed Wire Discharge Method", Journal of Ceramic Processing Research, 2007, vol. 8, No. 2, pp. 114-118.
Jiang, et al., "Size-Dependent Melting Properties of Tin Nanoparticles", Chemical Physics Letters, 2006, pp. 492-496, vol. 429, Science Direct.
Kanninen, et al., "Influence of Ligand Structure on the Stability and Oxidation of Copper Nanoparticles", Journal of Colloid and Interface Science 318 (2008) pp. 88-95.
Lisiecki, et al., "Control of the Shape and the Size of Copper Metallic Particles", J. Phys. Chem 1996, 100, pp. 4160-4166.
Mott, et al., "Synthesis of Size-Controlled and Shaped Copper Nanoparticles", Langmuir 2007, 23, pp. 5740-5745.
Wu, et al., "Simple One-Step Synthesis of Uniform Disperse Copper Nanoparticles", Mater. Res. Soc. Symp. Proc. vol. 879E, 2005 Materials Research Society, pp. Z6.3.1-Z6.3.6.
Wu, et al., "One-Step Green Route to Narrowly Dispersed Copper Nanocrystals", Journal of Nanoparticle Research (2006) pp. 965-969.
Yeshchenko, et al., "Size-Dependent Melting of Spherical Copper Nanoparticles Embedded in a Silica Matrix", Physical Review B 75 (2007), pp. 085434-1 to 085434-6.
Product Description—"Copper Nanoparticle and Cupric Salt Product Specialized Team", Suzhou Cantuo Nano Technology Co. Ltd. 2010.

(Continued)

Primary Examiner — Roy King
Assistant Examiner — Ngoclan Mai
(74) Attorney, Agent, or Firm — McDermott Will & Emery LLP

(57) ABSTRACT

A composition may have metal nanoparticles having a diameter of 20 nanometers or less and have a fusion temperature of less than about 220° C. A method of fabricating the metal nanoparticles may include preparing a solvent, adding a precursor with a metal to the solvent, adding a first surfactant, mixing in a reducing agent, and adding in a second surfactant to stop nanoparticle formation. Copper and/or aluminum nanoparticle compositions formed may be used for lead-free soldering of electronic components to circuit boards. A composition may include nanoparticles, which may have a copper nanocore, an amorphous aluminum shell and an organic surfactant coating. A composition may have copper or aluminum nanoparticles. About 30-50% of the copper or aluminum nanoparticles may have a diameter of 20 nanometers or less, and the remaining 70-50% of the copper or aluminum nanoparticles may have a diameter greater than 20 nanometers.

9 Claims, 4 Drawing Sheets

OTHER PUBLICATIONS

Product Description—"Nano-Copper", Sun Innovations, Inc. 2005-2010.
Product Description—"Copper Nanoparticle, Cu", NaBond Technologies Co., Ltd. 2001-2009.
Product Description—"Copper Nanoparticles", American Elements 2001-2010.
Product Description—"Powders: Nanoparticles & Nanopowders", SkySpring Nanomaterials, Inc.
Product Description—"Copper Nano Powder" TradeKey 2011.
Product Description—Metal & Alloy Nanoparticles, Nanoshel 2007-2009.
Product Description—"Nanopowders" Sigma-Aldrich 2010.
Product Description—Copper Nanoparticle (Copper Nanopowder), Suzhou Canfuo Nano Technology Co., Ltd. 1997-2011.
M. Attarian Shandiz, Effective Coordination Number Model for the Size Dependency of Physical Properties of Nanocrystals, Journal of Physics: Condensed Matter, 2008, pp. 1-9, 20, IOP Publishing.
Mostafa Mirjalali, et al. Prediction of Nanoparticles' Size-Dependent Melting Temperature Using Mean Coordination Number Concept, Journal of Physics and Chemistry of Solids, 2008, pp. 2116-2123, 69.
Pulkkinen, et al., "Poly(ethylene imine) and Tetraethylenepentamine as Protecting Agents for Metallic Copper Nanoparticles", Applied Materials & Interface, (2009) vol. 1, No. 2, pp. 519-525.

\* cited by examiner

LEAD SOLDER-FREE ELECTRONICS

CROSS-REFERENCES TO RELATED APPLICATIONS

The present application claims the benefit of priority under 35 U.S.C. §119 from U.S. Provisional Patent Application Ser. No. 61/097,175, entitled "SOLDER-FREE ELECTRONICS," filed on Sep. 15, 2008, which is hereby incorporated by reference in its entirety for all purposes.

STATEMENT REGARDING FEDERALLY SPONSORED RESEARCH OR DEVELOPMENT

The invention was made with Government support, and the Government has certain rights in the invention under Contract No. FA8650-08-C-5509 awarded by AFRL, Wright-Patterson Air Force Base, OH 45433.

BACKGROUND

Until recently, most electronic circuits were manufactured using lead-based soldering material. However, in response to regulatory changes, lead (Pb) is being phased out of electronic manufacturing. For example, under the Restriction of Hazardous Substances (RoHS) directive, the European Union outlawed the use of Pb for most electronics produced after June 2006. Military and medical products may remain exempt for some time, but will eventually be subject to similar restrictions. Electronics made using lead-based soldering material is reliable and a large investment has gone into the manufacturing infrastructure that uses lead-based material for soldering electronic components. The worldwide phasing out lead-based soldering material has raised serious concerns regarding reliability of alternative methods and also raised issues of additional capital investment required to phase out certain manufacturing infrastructure.

Lead-free solder replacements in practice today use eutectic alloys such as tin-copper (SnCu), tin-silver (SnAg), and tin-copper-silver (SnAgCu), all generally referred to as Sn—Ag—Cu (SAC) material. The use of SAC soldering materials suffer from several drawbacks. For example, while lead-based soldering material has a eutectic at 183° C., SAC soldering materials have higher melting points with processing temperatures around 260-300° C. To withstand such high temperatures experienced during the soldering process, other materials in an electronic product, such as a printed circuit board (PCB) or a component packaging material is required to be more robust and are therefore typically more expensive. For example, glass transition temperature (temperature at which a material ceases to be solid and becomes flexible) of several commonly available polymers are: FR-4 (<130° C.), BT epoxy (180° C.), cyanate ester (230° C.) and polyimide (250-250° C.). The cost of the polymers with the higher glass transition temperatures tends to be more. The typical PCBs are of the FR-4 type or polymer substrate materials that have even a lower glass transition temperature than that of FR-4. In one aspect, the cost of the polymers with higher glass transition temperature is an important issue. FR-4, at glass transition temperatures higher than 125° C., can withstand a process temperature up to 230° C., which has been the proven real-world performance.

Furthermore, reliability of electronics products manufactured using SAC soldering material suffers due to uncontrolled tin whisker growth resulting in rapid and uncontrollable joint failure. The reliability issue is most critical for military and space applications where long life and reliability is of utmost importance.

In one aspect, a better technique for lead solder-free electronics is needed.

SUMMARY

In one exemplary aspect, a composition may comprise metal nanoparticles having a diameter of 20 nanometers or less but greater than zero. The metal nanoparticles may comprise copper or aluminum nanocores. The composition may have a fusion temperature of less than about 220° C.

In another exemplary aspect, a method of fabricating a nanomaterial is disclosed. The method may comprise preparing a solvent and adding a precursor to form a solution. The precursor may comprise a metal, which may be aluminum or copper. The method may further comprise adding a first surfactant to the solution, mixing in a reducing agent, at a mixing rate, with the solution until symptoms of nanoparticle formation occur in the solution, and adding a second surfactant to the solution to stop nanoparticle formation and agglomeration after the symptoms of nanoparticle formation occur.

In another exemplary aspect, a method of soldering an electronic component to a circuit board is disclosed. The method may comprise applying a soldering paste, which comprises a nanomaterial, between the electronic component and the circuit board. The nanomaterial may comprise a plurality of nanoparticles surrounded by a surfactant. The method may further comprise heating the soldering paste until the surfactant melts causing the plurality of nanoparticles to fuse, and allowing the heated soldering paste to cool down to form a soldering joint between the electronic component to the circuit board.

In another exemplary aspect, a composition may comprise nanoparticles, which may comprise a copper nanocore, an amorphous aluminum shell and an organic surfactant coating. The nanoparticles may have a diameter of 20 nanometers or less but greater than zero.

In another exemplary aspect, a method of manufacturing a printed circuit may comprise applying a metal nanomaterial, which may comprise a surfactant, to a surface. The method may further comprise tracing, by a heat source, a circuit line of the printed circuit on the surface. The tracing may cause the surfactant on the traced circuit line to evaporate. The method may further comprise treating the surface with a solvent to cause the untraced metal nanomaterial to wash off.

In yet another exemplary aspect, a composition may comprise copper or aluminum nanoparticles. About 30-50% of the copper or aluminum nanoparticles may have a diameter of 20 nanometers or less but greater than zero, and the remaining 70-50% of the copper or aluminum nanoparticles may have a diameter greater than 20 nanometers.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
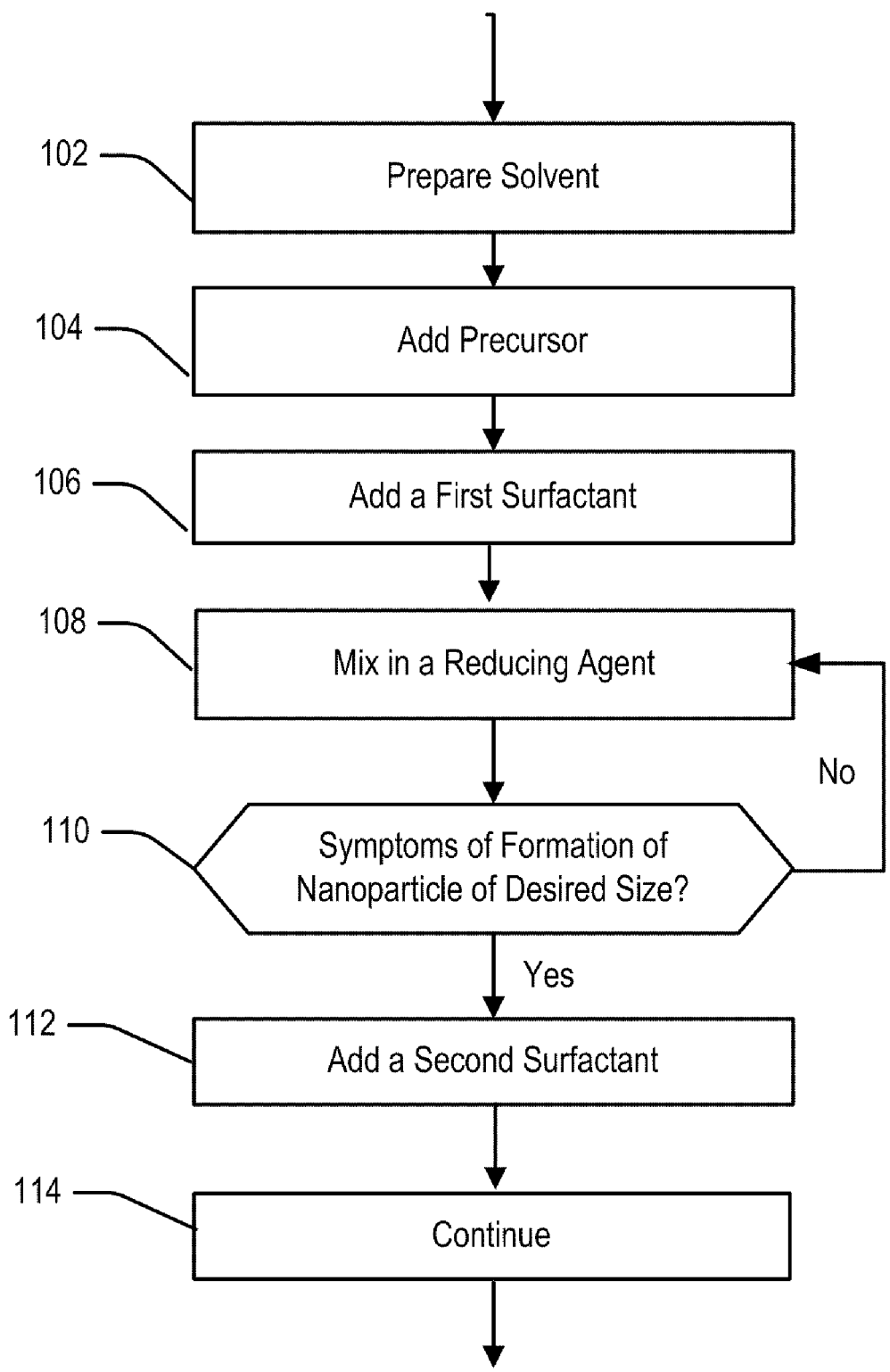
FIG. 1 is a flow chart illustrating an example of an operation of fabricating nanomaterial, in accordance with certain configurations of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

U.S. patent application Ser. No. 11/798,529, entitled "RHENIUM NANOPARTICLES" is incorporated herein by reference in its entirety. U.S. patent application Ser. No. 12/426,160, entitled "CARBON NANOTUBE SYNTHESIS USING REFRACTORY METAL NANOPARTICLES AND MANUFACTURE OF REFRACTORY METAL NANOPARTICLES" is incorporated herein by reference in its entirety.

In one aspect, the desired fusion temperature for the solder is achieved using a property of certain nanostructured materials that their fusion temperatures drop with reduction in particle size. The term "fusion temperature" may refer to the temperature at which a soldering material liquefies, giving the appearance of melting. For example, rhenium nanoparticles having between 5 and 25 nanometer (nm) diameter exhibit a fusion temperature of about 600-800° C., a significant reduction from 3180° C., the melting point of non-nanoparticled rhenium. Similarly, copper also exhibits a similar property in that the fusion temperature of copper nanoparticles (or copper nanomaterial) is significantly lower in comparison to the melting point of non-nanoparticle copper (1083° C.). Aluminum nanomaterials also exhibit such a reduction in fusion temperature. Generally speaking, lower diameter nanoparticles have lower fusion temperature. For example, the fusion temperature of a copper nanomaterial, having a nanoparticle size in the 2-5 nanometer range, could have a fusion temperature of approximately 200° C., whereas with the particle size in the 40-50 nm range, the copper nanomaterial may have a fusion temperature of about 750° C., and at 20-30 nm particle size, the fusion temperature may be about 450° C. Similarly, a nanoparticle mixture comprising nanoparticles sized 20 nm or smaller may have a fusion temperature of less than about 220° C.

It is advantageous to use a material such as copper or aluminum to produce low fusion temperature nanomaterial for use as a soldering agent because of high conductivity of copper or aluminum. Furthermore, it is possible to lay down these metals on circuit boards as thin traces or in form of ball grid arrays (BGA) having very fine pitch, thereby facilitating manufacturing of densely packed circuitry. Table 1 shows electrical and thermal properties of copper compared to tin-based and lead-based soldering materials.

TABLE 1

| Material | Oxide free Cu | Sn Solder/ 3.5% Ag | Pb Solder/ 5% Sn |
| --- | --- | --- | --- |
| Ultimate Tensile Strength (Mpa) | 221-455 | 38.7 | 27.6 |
| Electrical resistivity (ohm-cm) | 1.71E–06 | 1.10E–05 | 2.00E–05 |
| Thermal conductivity (W/m-K) | 383-391 | 33 | 23 |

FIG. 1 is a flow chart showing operations performed in fabricating a nanomaterial, in accordance with certain configurations of the present disclosure. In certain configurations, the operations shown in FIG. 1 may be performed in a single flask. The flask may be, for example, as disclosed in the above referenced U.S. patent application Ser. No. 12/426, 160. In the description below with respect to FIG. 1, processes are generally described with reference to copper nanoparticle fabrication. However, it is understood that nanoparticles for other metals (e.g., aluminum) may be fabricated along the same principles.

At operation 102, a solvent is prepared. The solvent acts as a medium in which the subsequent nanoparticle fabrication takes place by a reduction process in a solution comprising suitable precursors, as described in the present disclosure. Some examples of solvents are disclosed in the above referenced U.S. patent application Ser. No. 11/798,529.

At operation 104, one or more copper precursors are added to the solvent to form a solution. A precursor provides the solvent with copper atoms necessary to form copper nanoparticles. Examples of copper precursors include copper chloride ($CuCl_2$), copper oxide (CuO) by dissolution in acid or base with the help of amines (e.g., as described in U.S. Pat. No. 3,637,508), or copper hydroxide ($Cu(OH)_2$) with ammonia. In certain configurations, copper nanoparticles may be made via the reduction of a suitable copper precursor (salt) such as halide, nitrate, acetate, sulphate, formate and oxide, etc.

In certain configurations, a copper precursor requires drying to avoid oxidization of nanoparticles by moisture and air-oxygen. In certain configurations, in situ drying may be performed. For example, hydrous copper chloride ($CuCl_2*2H_2O$) may be dried using processes that may be represented by the following chemical equations (1) and (2).

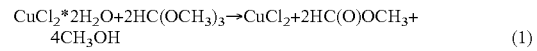

$$CuCl_2*2H_2O + 2HC(OCH_3)_3 \rightarrow CuCl_2 + 2HC(O)OCH_3 + 4CH_3OH \quad (1)$$

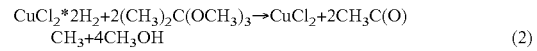

$$CuCl_2*2H_2O + 2(CH_3)_2C(OCH_3)_3 \rightarrow CuCl_2 + 2CH_3C(O)CH_3 + 4CH_3OH \quad (2)$$

One skilled in the art will recognize that the chemical reaction above produces anhydrous $CuCl_2$ and, as a side product, a desired anhydrous solvent methanol, thus eliminating time-consuming drying procedures.

At operation 106, a first surfactant is added to the solution. The addition of the first surfactant may help control the size of nanoparticles by controlling the range and distribution of diameter sizes of the nanoparticles. In certain configurations, the first surfactant may be chosen from a variety of organic amines having various chain lengths. For copper nanomaterial formation, the amines are chosen, in part, because the amines coordinate well to copper, but at the same time can be removed easily upon moderate heating or vacuum to expose the nanoparticles enabling them to fuse.

At operation 108, a reducing agent is mixed in with the solution at a predetermined mixing rate. The reducing agents may include one or more of lithium (Li), sodium (Na) or potassium (K) with a suitable catalyst. In certain configurations, Sodium Borohydride ($NaBH_4$) may be used as a reducing agent. The chemical reaction for formation of nanoparticles, represented as nanoCu, when using copper chloride precursor and sodium ion as the reducing agent, is shown in Eq. (3)

$$CuCl_2 + 2Na^* \rightarrow 2NaCl + nanoCu \quad (3)$$

In certain configurations of the present disclosure, copper oxide (CuO) may be used as the precursor, dissolved in a mineral acid or base and citric acid, ascorbic acid or sodium borohydride used as the reducing agent. The chemical reaction when using copper oxide may be represented by equations (4a) and (4b) below.

$$CuO + 2HCl \rightarrow 2Cl^- + Cu^{2+} + H_2O \quad (4a)$$

$$Cu^{2+} + \text{ascorbic acid} \rightarrow nanoCu + \text{dehydroascorbic acid} + 2H^+ \quad (4b)$$

In certain configurations, copper chloride ($CuCl_2$) may be used as the precursor. When using copper chloride with sodium borohydride as the reducing agent, the corresponding reaction maybe represented by equation (5) below.

$$CuCl_2 + 2NaBH_4 \rightarrow nanoCu + 2NaCl + H_2 + B_2H_6 \quad (5)$$

In certain configurations, about 3 grams of $CuCl_2 \cdot 2H_2O$ may be dissolved in about 45 ml of glyme or tetrahydrofuran (THF) with about 10 ml dihexylamine and about 4 grams DDA. Sodium borohydride (about 19 ml 2M solution) may be added at a controlled rate at room temperature. When color of the solvent turns to green, about 30 ml water with 5-10% diethylenetriamine (DETA) may be added and 30 ml hexane with 5-10% n-butylamine may be mixed by stirring for a few minutes. The nanoparticles are hydrophobic and may transfer into the organic phase and may be extracted and separated from the byproducts in such a fashion. The hexane may be evaporated to isolate the solid nanoparticles. In certain configurations, larger nanoparticles may be separated by centrifugation.

In certain configurations, copper nitrate may be used as the precursor and citric or ascorbic acid may be used as the reducing agent. The resulting chemical reaction may be represented by equation (6) below.

$$Cu(NO_3)_2 + \text{citric acid/ascorbic acid} \rightarrow nanoCu + \text{organic side products} \quad (6)$$

In certain configurations, the following steps may be used to perform the operations.

(1) Provide a 50 mL aqueous solution with a concentration of approximately 0.4 M L-ascorbic acid containing 4 grams PVP (solution 1).

(2) Provide a 50 mL aqueous solution of 1 g Copper (II) acetate×$1H_2O$ and 1 ml ammonia water (conc) and 7 ml n-butylamine and 4 g PVP resulting in a blue solution ($Cu^{2+}$-ammonia complex) (solution 2).

(3) Add solution 2 to solution 1, (4) Stir and heat to +65° C. (about 30 min duration)

(5) Allow the mixture to cool back to approximately room temperature.

(6) Add, using a controlled rate, about 25 drops of sodium borohydride (2M solution) until color of the mixture starts to change.

(7) Extract nanoparticles by a process such as centrifugation or extraction with hexane as outlined above.

Use of reducing agents that have a relatively high (e.g., having magnitude >2 volts) reduction potential helps in formulation of nanoparticles from electropositive elements. Accordingly, in one aspect, the reducing agent comprises a molecular sodium solution formed in the presence of naphthalene with approximately 2.50 volts reduction potential.

At step 110, the solution is monitored for symptoms of formation of nanoparticles. The symptoms may include change of color of the solution and/or amount of gas being released (bubbling) during the process. For example, when using CuO as the precursor for the formation of copper nanomaterial, the color of the solution initially is blue-green. After adding the reducing agent, as the reaction proceeds the color changes to dark green indicating formation of nanoparticles followed by yellow and orange-brown, when the nanoparticles begin to grow to larger sizes. Accordingly, in certain configurations, the mixing rate of the reducing agent is held sufficiently low (e.g., 1.5 milliliter per minute) such that the reducing agent is mixed in only while the symptoms of nanoparticle formation of the desired size are exhibited. When the symptoms change (e.g., yellow color begins to turn to brown), the mixing of reducing agent may be discontinued.

In certain configurations where $NaBH_4$ is used as the reducing agent (e.g., equation (5) above), during the formation of nanoparticles gas may be released ($H_2$ and $B_2H_6$) and may be a visible indication that the nanoparticle formation process is occurring.

At step 112, when the symptoms of formation of nanoparticles change (e.g., indicating that nanoparticles of a certain size have formed in the solution), a second surfactant may be added to the solution to facilitate termination of nanoparticle formation or agglomeration. The second surfactant may also help add stability to the nanoparticles formed in the solution by protecting the nanoparticles from further exposure to reacting chemicals and growth. Stabilization and protection of such nanoparticles help stop the nanoparticles from oxidizing and reacting with chemicals in the air when exposed to air oxygen and moisture. Oxidation and chemical reactions are undesirable because exposed nanoparticles can exhibit pyrophoric behavior.

In certain configurations of the present disclosure, organic amines, phosphines, and sulphur containing organic ligands may be used as the second surfactant. The choice of a second surfactant may involve a trade-off between the boiling temperature of a surfactant (the temperature at which the surfactant allows encapsulated nanoparticles to become relatively free) and the predictability of size of nanoparticles. For soldering, a surfactant that facilitates the fusion process during soldering by releasing metal nanoparticle for joining and fusion may be desirables. Accordingly, in one aspect, amines, known to be releasable upon moderate heating, maybe used as the second surfactants. Amines are known to stabilize highly reactive alane ($AlH_3$) and such compounds are commercially available (e.g., $(CH_3)_3N$—$AlH_3$, $(C_2H_5)_3N$—$AlH_3$). Other amines possible for use as the second surfactant include n-butyl, hexyl, octyl, dodecyl amine, tripentyl amine, triethylenediamine and ethylene diamine. In certain configurations, phosphines such as tributylphosphine and trioctylphosphine as well as trioctylphosphineoxide may also be used as second surfactants or in combination with an amine.

Generally speaking, a phosphine surfactants may exhibit a higher boiling point and may bond more strongly with the nanoparticles and therefore volatilize less readily. In addition, quaternary ionic amines such as tetraoctylammonium bromide and tetraethylammonium bromide may also be used to control nanoparticle size in the early stages of particle growth by covering the nanoparticle surface (weak electrostatic forces) and slowing down agglomeration. In certain configurations, a mixture of surfactants having weaker and stronger bonding characteristics may be used to achieve a balance between the fusion temperature of the resulting nanomaterial and how quickly the process of nanoparticle formation needs to be stopped.

At step 114, the resulting solution comprising nanoparticle material may be changed to a form suitable for storage or use in another application. For example, in certain configurations, the nanomaterial may be converted into a nanopowder. A "wet chemistry" approach, giving the benefit of low cost manufacturing and facile scalability, may be used for formation of such a nanopowder. In certain configurations, the nanomaterial may be formulated in a form convenient for use as soldering material (e.g., in the form of a paste).

Figure 2:
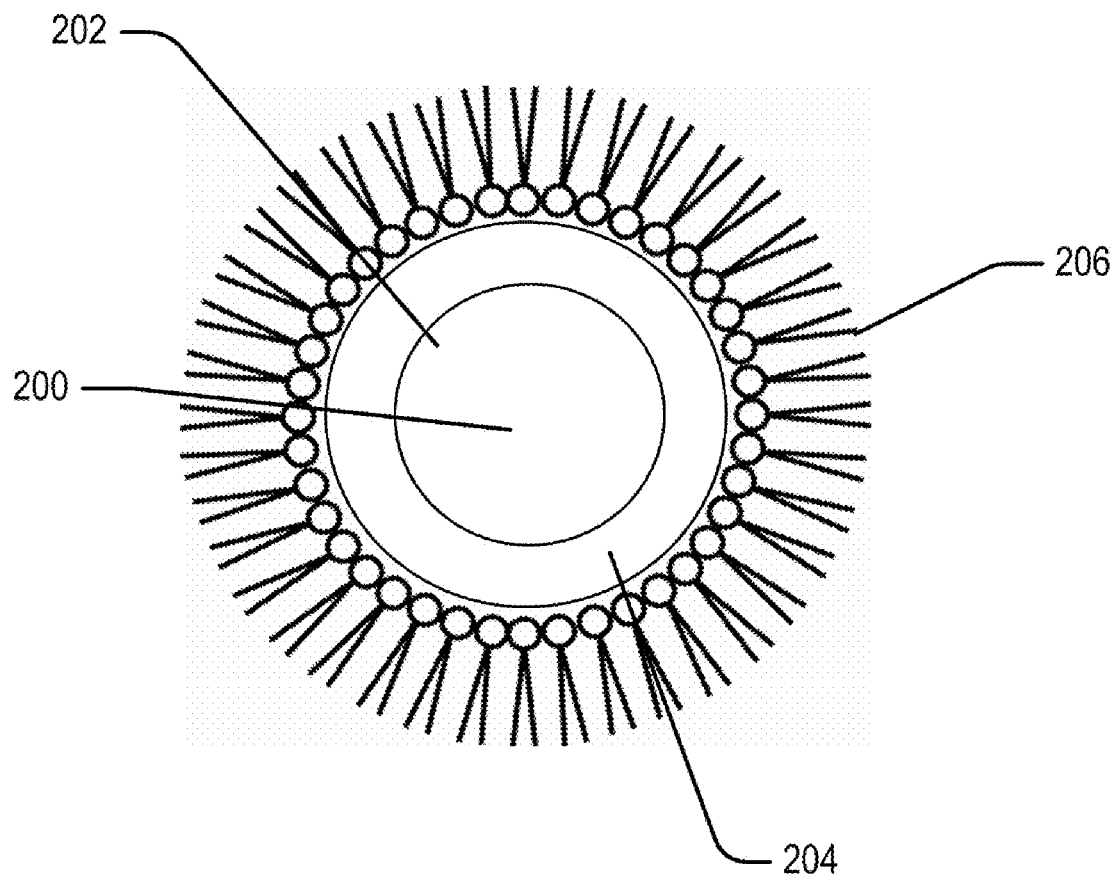
FIG. 2 is a conceptual illustration of a nanoparticle, in accordance with certain configurations of the present disclosure.

FIG. 2 illustrates exemplary nanoparticle structure in accordance with certain aspects of the present disclosure. A nanoparticle 200 may comprise a core 202, a shell layer 204 (typically an amorphous shell layer) and a surfactant coating 206. The core 202 may be dense and crystalline due to the high pressures of up to 5 GPa present during the formation process. The shell layer 204 may be amorphous, in which the atoms may be arranged more randomly, compared to the core 202, due to higher radius of the nanoparticle's curvature. The amorphous arrangement in the shell layer 204 prevents the atoms from assuming a stable bulk lattice arrangement and keeps them in a thermodynamically unstable state such that very little energy may cause the atoms in the shell layer 204 to melt and flow. The arrangement of atoms in the shell layer 204 is, in part, responsible for the reduced fusion temperature. In general, there may not be a sharp boundary between the core 202 and the shell layer 204.

The process described with reference to FIG. 1 may also be adapted for fabrication of nanoparticles for different metals such as aluminum. For fabrication of aluminum nanomaterial, an aluminum precursor such as triethylaluminum (Al$(C_2H_5)_3$) and several alane derivatives may be used because these chemicals are know to decompose at temperatures between 160° C. to 100° C. in the gas phase. Furthermore, these precursors typically decompose into the metal and a volatile byproduct. This behavior can be represented by equation (7) below for triethylaluminum (Al$R_3$), heated to between 100° C. and 160° C. In solution, however, the precursor is stabilized resulting in an observed decomposition temperature above about 250° C.

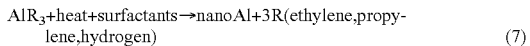

$$AlR_3 + heat + surfactants \rightarrow nanoAl + 3R(ethylene, propylene, hydrogen) \qquad (7)$$

In a certain configuration of the present disclosure, aluminum nanoparticles can be produced by the reduction of for example an aluminum halide precursor by activated sodium, as shown by equation (8) below:

$$AlCl_3 + 3Na^* \rightarrow 3NaCl + nanoAl \qquad (8)$$

Soldering material having a low fusion temperature may be advantageous in certain applications because low fusion temperature facilitates the use of low cost packaging and board materials. In certain configurations, copper and aluminum nanomaterials may be mixed to obtain a soldering nanomaterial having a lower fusion temperature compared to a copper-only soldering nanomaterial.

In certain configurations of the present disclosure, a mixture of copper and aluminum nanomaterials may be made by fabricating copper nanomaterial and aluminum nanomaterial sequentially. Copper may be reduced first to form nanoparticles, followed by thermal decomposition of an aluminum precursor. The copper nanoparticles may function as nucleation sites and aluminum may deposit and coat the surface of the copper nanoparticles resulting in a copper core 202 and an aluminum shell layer 204. The fusion temperature of the mixture may be based on the ratio of copper/aluminum atoms in the shell layer 204.

Accordingly, in one aspect, a reduced fusion temperature soldering material can be fabricated using copper and aluminum nanomaterials. The fusion temperature of the soldering nanomaterial can be tailored via alloying copper nanoparticles with aluminum. As the amount of aluminum used in relation to the amount of copper used in nanoparticle formation, the fusion temperature of the resulting nanomixture is closer to the fusion temperature of aluminum-only nanomaterial (approximately 130° C.).

In certain configurations of the present disclosure, the copper and aluminum nanoparticles can be made separately and then mixed in the desired ratio to fabricate the final nanomaterial. In soldering nanomaterial created by mixing copper and aluminum nanomaterials, the part of the mixture with lower melting point (copper or aluminum, depending on size of nanoparticles) will migrate first and function as glue bonding the other nanoparticles together. After soldering, the nanomaterial will typically convert to a metal matrix composite having cores of original nanomaterial that are surrounded by thin layers the other nanomaterial. In certain configurations, the mixing of copper and aluminum nanoparticles can be advantageously used to fabricate pastes containing about 30-50% nanoparticles (in the >0 and ≦20 nanometer range) and the remaining 70-50% can be much larger in size, for example, micron size particles (e.g., 1 micron, 10 microns, 20 microns or larger). The nanoparticles may function as a glue and may bond the larger particles together and to the adjacent surfaces. In certain configurations, amounts less than about 30% may lead to increasingly porous materials with less bonding and therefore reduced mechanical integrity.

Because the above described processes and selection of chemicals facilitate control over rate of nanoparticle formation (e.g., by controlling the mixing rate) and diameter distribution of the resulting nanoparticles (e.g., by choice of a surfactant), homogeneous and isotropic nanomaterial having approximately same fusion temperature as traditional lead solder can be fabricated, making it possible to use the nanomaterial as a drop-in replacement of lead solder used in the traditional soldering equipment.

Practitioners of the art will appreciate that various processes of copper and aluminum nanomaterial formation described above may be synthesized using a single reaction apparatus, making it practically efficient and economical to fabricate soldering nanomaterial of a desired fusion temperature.

In certain configurations, depending on the desired fusion temperature, copper nanoparticles can be coated with a thin layer of aluminum (Al) to further reduce the fusion temperature of the resulting nanomaterial. Accordingly, in one aspect, a nanomaterial comprising copper nanoparticles coated with Al may be fabricated to achieve a fusion temperature approximately equal to 130° C.

It will be appreciated by those skilled in the art that the high radius of curvature of the fabricated nanoparticles prevents the surface layer atoms to be in a thermodynamically activated state requiring very little energy to start migrating and flowing. The atoms may quickly settle in a thermodynamically stable lattice arrangement forming a solid bulk material. The nanoparticle core may not take part in the formation of the lattice arrangement and the solid bulk material comprising copper nanocores surrounded by a thin layer of a copper lattice arrangement exhibits properties such as increased strength and fracture toughness. The lattice arrangement is retained to relative high temperatures before grain growth sets in, because the nanocores are stabilized by the matrix formed due to the lattice arrangement.

As described previously, in one aspect, the nanomaterial produced in accordance with the present disclosure may be a drop-in replacement of lead based solder. No significant changes and capital investment may be needed to adjust existing assembly lines. In another aspect, a lead-free soldering material having a fusion temperature around 200° C. facilitates low cost packaging compared to a 260-300° C. fusion temperature exhibited by SAC-based soldering material. Furthermore, the use of copper helps with formation of strong joints enhanced fracture toughness. Also, the use of such nanomaterial may minimize coefficient of thermal expansion (CTE) mismatch because vias, pins and bonding material can be all copper based. Furthermore, unlike SAC material, copper nanomaterial does not exhibit whisker formation, thereby improving circuit board life and reliability. The use of nanomaterial also ensures very high uniformity of material, down to the nanoscale. Due to reduced fusion temperature, very rapid fusion process (<1 min) enabling a fast assembly process may be possible. In addition, copper-based nanomaterial offer the advantage of higher electrical and thermal conductivity compared to SAC based materials. In one aspect, due to the use of copper in conjunction with nanoparticle technology joints may be made to be relatively insensitive to variations in composition, pad finishes, and process parameters, facilitating reliable manufacturing under a large variety of conditions.

The use of organic surfactants, as described before, creates nanomaterial having organic surfactant coating 206 on the nanoparticles 200, making the nanomaterial soluble in many organic solvents. This advantageously allows the formulation of paint-like slurries and pastes for spray-on, brush on, or other desired method of application. Suitable solvents such as ethanol, isopropanol (IPA), acetone, toluene, as well as additives such as paraffin wax and organic acids may be used for a variety of applications.

Figure 3A:
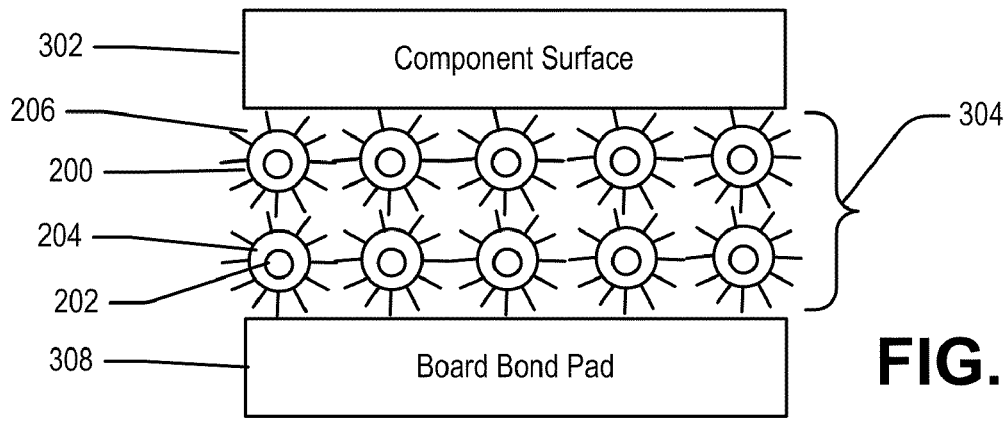
FIG. 3A is a conceptual block diagram illustrating application of a soldering nanomaterial to solder an electronic component to a circuit board, in accordance with certain configurations of the present disclosure.
Figure 3B:
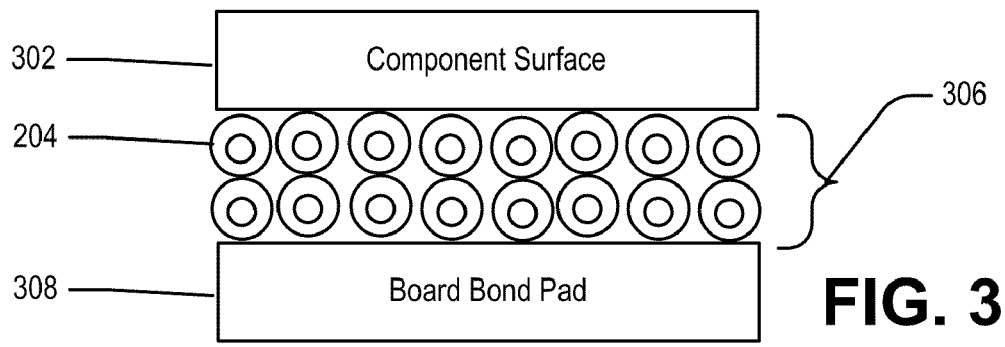
FIG. 3B is a conceptual block diagram illustrating the soldering nanomaterial in FIG. 3A, after application of heating, in accordance with certain configurations of the present disclosure.
Figure 3C:
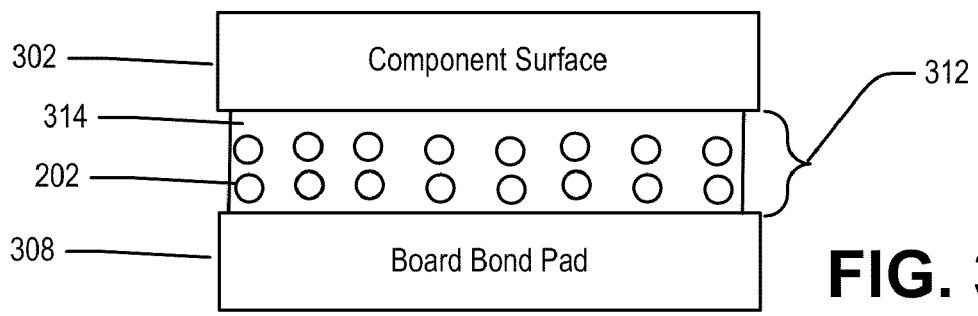
FIG. 3C is a conceptual block diagram of a soldering joint formed from the soldering nanomaterial in FIGS. 3A and 3B, in accordance with certain configurations of the present disclosure.

FIGS. 3A, 3B and 3C illustrate an example of soldering an electronic component to a board (e.g., a PCB) using a nanomaterial, in accordance with certain configurations of the present disclosure. In a typical soldering operation, an electronic component is attached to a board by soldering contact points (e.g., pins, bond pads) of the component to the board.

FIG. 3A shows a nanomaterial layer 304 comprising nanoparticles 200 applied between an electronic component surface 302 and a board bond pad 308. The nanoparticles 200 have a core 202, an amorphous shell layer 204 and a surfactant coating 206, as previously discussed with respect to FIG. 2. While the nanoparticles 200 in FIG. 3A are shown to have approximately same diameter, in general, the nanomaterial layer 304 may comprise of nanoparticles 200 having a range of diameters (e.g., between 2 and 20 nanometers). The nanomaterial layer 304 is then heated to the fusion temperature of the nanomaterial. The nanolayer 304 may be heated using a laser, a rapid thermal annealing (RTA) system or other well known techniques.

FIG. 3B is a conceptual block diagram illustrating exemplary effect of heating the nanomaterial layer 304. In the illustration, the surfactant 206 has evaporated or melted away due to the elevated temperature, exposing the shell layer 204 and nanoparticle cores 202 in a transitional layer 306. Note that because the surfactant 206 has evaporated, the component surface 302 and the board bond pad 308 now may be physically closer to each other in comparison the configuration in FIG. 3A.

FIG. 3C shows exemplary configuration showing the component surface 302 soldered to the board bond pad 308. In the illustrated configuration, the soldering layer 312 comprises a relatively homogenous conductive layer 314 formed by fusion of the amorphous shell layers 204 of the nanoparticles 200 due to exposure to heat and nanoparticle cores 202 embedded within the conductive layer 314. Because the shell layers 204 has now turned into a homogenous conductive layer 314, the component surface 302 and the board bond pad 308 may further be closer to each other than as shown in FIG. 3B. Application of heat using a traditional heating system used for soldering thus results in a small, conductive and relatively strong soldering joint between the component surface 302 and the board bond pad 308.

An additional advantage of the soldering nanomaterial may be that the total soldering time (including heat application time) is relatively short (e.g., 1 to 2 minutes), since the nanoparticles 200 anneal very rapidly. This is in part due to the nanoparticles 200 having an extremely small radius of curvature, forcing the atoms located in that surface shell into a thermodynamically unstable state. These unstable atoms liquefy rapidly at low temperature resulting in fusion of the unstable atoms into a thermodynamically more stable bulk lattice state High performance semiconductor integrated circuits (ICs) and components frequently have low thermal budgets. These devices can typically withstand fairly low exposure to higher temperatures before degradation such as dopant redistribution occurs. The low fusion temperature aspect of the nanomaterial fabricated according to certain aspects of the present disclosure render the use of such nanomaterial safe by reducing chances of inadvertent overheating of electronic components during soldering.

Figure 4:
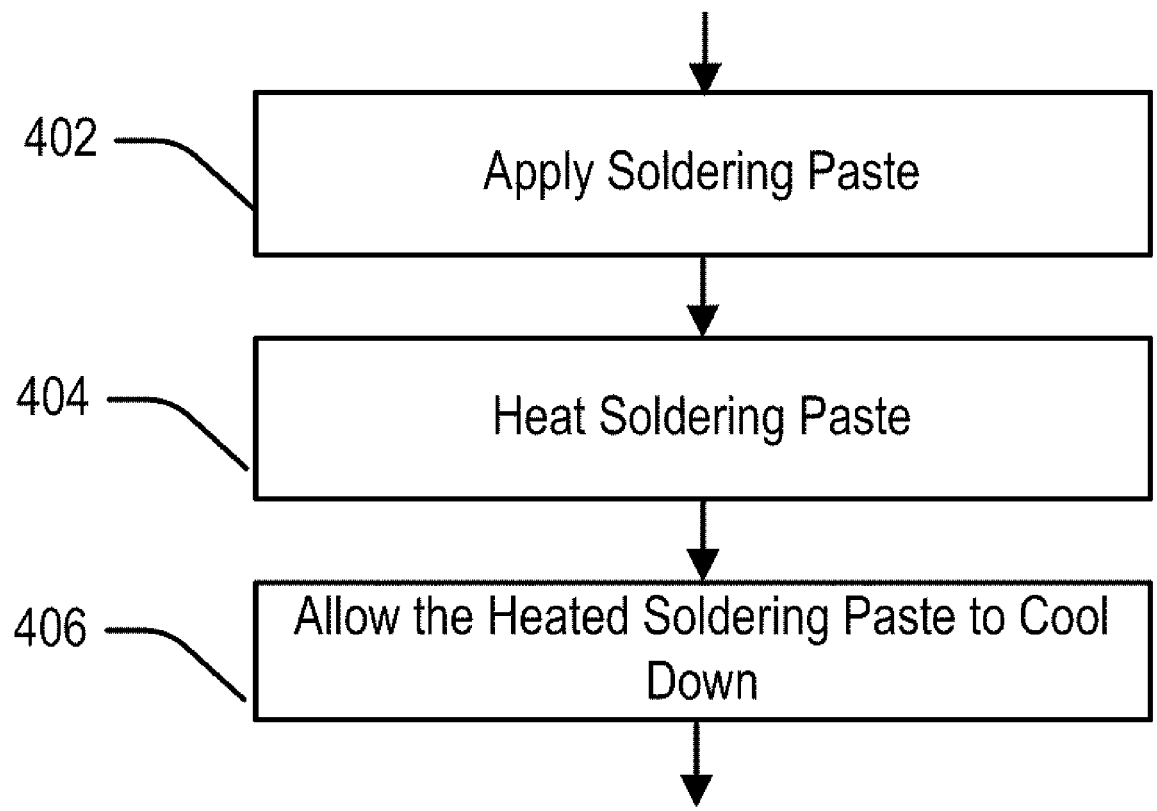
FIG. 4 is a flow chart illustrating an example of a sequence of operations for soldering an electronic component to a circuit board, in accordance with certain configurations of the present disclosure.

FIG. 4 is a flow chart of an exemplary process of soldering an electronic component to a circuit board. At operation 402, soldering paste comprising nanomaterial is applied between an electronic component and a circuit board. The nanomaterial may comprise nanoparticles 200 covered in shell layer 204 and surrounded by a surfactant coating 206, as described with respect to FIGS. 3A-3C. At operation 404, the soldering paste is heated until the surfactant evaporates, enabling the nanoparticles 200 to fuse. The heating may be achieved by, for example, heating with a conventional oven or a more advanced laser. As described with respect to FIGS. 3B and 3C, the nanoparticles 200 fuse into a layer 312 when the surfactant coating 206 evaporates (or melts) away allowing formation of a fusion layer 312. At operation 406, the heating soldering paste is allowed to cool down. This results in a soldering joint being formed between the electronic component and the circuit board (e.g., conductive layer 314 in FIG. 3C).

In one aspect, the additional advantage of the nanomaterials of the present disclosure relates to the ability to "drop-in" the material into existing solder manufacturing processes. The nanomaterial can therefore be readily incorporated into an existing production facility, enabling rapid technology transfer and product insertion. In one aspect, soldering material fabricated using the nanomaterials of the present disclosure are used to solder electronic components to a printed circuit. In one aspect, a printed circuit may refer to a circuit board, circuit components, an assembly of circuits, an assembly of integrated circuits and discrete components, or the like.

The mechanical joint properties of nanostructured copper and copper/aluminum alloy phases are robust because they are relatively insensitive to variations in composition, pad finishes and process parameters. Such systems may be homogeneous and isotropic nanostructured material with fairly well-known constitutive relations. In certain configurations, it is possible to fabricate nanomaterial that is highly compatible with current soldering methods, only minor changes such as solder pad sizing and pitch may have be made to current design tools and methods.

Nanomaterial fabricated in accordance with the present disclosure can be advantageously used in a variety of applications. In certain applications, the nanomaterial generated in accordance with the present disclosure may be used in manufacturing of printed circuits for solar cells. A typical solar cell assembly comprises electronics on a flexible substrate. Initially, a circuit may be prepared for printing on the flexible substrate, either by directly rendering the circuit on the flexible substrate or by preparing a photo mask for the circuit. Copper or aluminum nanomaterial fabricated into a paste may then be applied to the flexible substrate and "etched" as needed. The "etching" operation may be done as follows. First, a layer of the nanomaterial may be deposited on a surface. Next, a desired conducting line of the printed circuit (circuit lines) may be traced by a heat source such as a laser. The laser causes nanomaterial to heat up to its fusion temperature, thereby evaporating the surfactant on the traced line, leaving behind copper a conductive line. It will be appreciated that the use of lasers to etch conductive lines facilitates precise and thin copper conductive lines useful for dense circuit designs. Next, after tracing with laser, the remaining nanomaterial is washed off by treating with a suitable solvent. The washed off solution/mixture/paste may then be collected and re-used later to deposit a layer of copper nanomaterial on another board because the solvent will contain dissolved nanomaterial.

In certain applications, the copper nanomaterial may be used to design circuits using inkjet printing technology. The low fusion temperature property of copper nanomaterial may be used in conjunction with the ability to dissolve the copper nanomaterial to create a paste of desired thickness. The paste may be used as the "ink" for the printer. The combined action of ink jet ejection of the "ink" along with heating to the moderate fusion temperature may facilitate direct "printing" of circuits on a suitable printing material (e.g., a special paper or a circuit board).

The subject technology is illustrated, for example, according to various aspects described below. Numbered clauses are provided below for convenience. These are provided as examples, and do not limit the subject technology.

In one aspect, a low melting point composition suitable for lead-free soldering of electronic components may comprise a copper nanoparticle material, the nanoparticle material being dispersed with a solvent, the nanoparticle material having an average particle size equal to or less than 5 nanometers (Cu), where the low melting point composition is capable of forming a soldering joint. The solvent may be tetrahydrofuran.

In another aspect, a low melting point composition suitable for lead-free soldering of electronic components may comprise a aluminum nanoparticle material, the nanoparticle material being dispersed with a solvent, the nanoparticle material having an average particle size equal to or less than 10 nanometers (Al), where the low melting point composition is capable of forming a soldering joint.

In yet another aspect, the low melting point composition may comprise aluminum and/or copper nanoparticles having 20 nanometer particle size or less (but greater than zero) in the 30-50% proportion, and the remaining 70-50% comprising larger particles which can be in the micron size range (for example, 1 micron, 10 microns, 20 microns or larger). The smaller nanoparticles may function as a glue bonding the larger particles together and to the adjacent surfaces. An increasing smaller amount of small nanoparticles less than 30% may lead to increased porosity and loss of mechanical strength after fusion, which may be desired for certain applications. A paste composition may further include triethanolamine and/or organic acids as flux from acetic acid to hexadecanoic acid.

Those of skill in the art would appreciate that the various illustrative blocks, modules, elements, components, methods, and operations described herein may be implemented as electronic hardware, computer software, or combinations of both. For example, operation 110 may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various blocks may be arranged differently (e.g., arranged in a different order, or partitioned in a different way) all without departing from the scope of the subject technology. For example, the specific orders of blocks 102 and 104 in the process illustrated in FIG. 1 may be rearranged, and some or all of the operations may be partitioned in a different way.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

Terms such as "top," "bottom," and the like as used, and blocks in illustrations as drawn on top or bottom of another blocks in this disclosure should be understood as referring to an arbitrary frame of reference, rather than to the ordinary gravitational frame of reference. Thus, a top surface and a bottom surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A composition, comprising:
   metal nanoparticles, said metal nanoparticles comprising copper or aluminum nanocores, wherein about 30-50% of the metal nanoparticles have a diameter of 20 nanometers or less but greater than zero, and the remaining 70-50% of the metal nanoparticles have a diameter greater than 20 nanometers.

2. The composition of claim 1, comprising:
   an organic surfactant coating said metal nanoparticles making the composition soluble in a solvent.

3. A printed circuit comprising a conductive line having the composition of claim 1.

4. A composition, comprising:
   nanoparticles comprising a copper nanocore, an amorphous aluminum shell and an organic surfactant coating, wherein about 30-50% of said nanoparticles have a diameter of 20 nanometers or less but greater than zero, and the remaining 70-50% of the nanoparticles have a diameter greater than 20 nanometers.

5. A printed circuit comprising a conductive line having the composition of claim 4.

6. The composition of claim 4, wherein the organic surfactant coating comprises at least one of an amine and a phosphine.

7. The composition of claim 4, further comprising one or more of triethanolamine, acetic acid and hexadecanoic acid.

8. A composition comprising copper or aluminum nanoparticles, wherein about 30-50% of the copper or aluminum nanoparticles has a diameter of 20 nanometers or less but greater than zero, and the remaining 70-50% of the copper or aluminum nanoparticles has a diameter greater than 20 nanometers.

9. The composition of claim 8, further comprising one or more of triethanolamine, acetic acid and hexadecanoic acid.

* * * * *

UNITED STATES PATENT AND TRADEMARK OFFICE
CERTIFICATE OF CORRECTION

PATENT NO. : 8,105,414 B2
APPLICATION NO. : 12/512315
DATED : January 31, 2012
INVENTOR(S) : Alfred A. Zinn It is certified that error appears in the above-identified patent and that said Letters Patent is hereby corrected as shown below:

IN THE SPECIFICATION:

In Column 4, Lines 60-61: Replace "$CuCl_2 * 2\ H_2 + 2\ (CH_3)_2C(OCH_3)_3 \rightarrow CuCl_2 + 2\ CH_3C(O)CH_3 + 4\ CH_3OH$  (2)"

with -- $CuCl_2 * 2\ H_2O + 2\ (CH_3)_2C(OCH_3)_3 \rightarrow CuCl_2 + 2\ CH_3C(O)CH_3 + 4\ CH_3OH$     (2) --

Signed and Sealed this
Nineteenth Day of June, 2012

David J. Kappos
*Director of the United States Patent and Trademark Office*